United States Patent [19]

Ibe et al.

[11] Patent Number: 5,205,080
[45] Date of Patent: Apr. 27, 1993

[54] JIG FOR CLAMP-POSITIONING SINGLE CRYSTAL INGOT

[75] Inventors: Hiroyuki Ibe, Nyu; Tosihisa Nakata, Takehu, both of Japan

[73] Assignee: Shin-Etsu Handotai Company, Limited, Tokyo, Japan

[21] Appl. No.: 828,261

[22] Filed: Jan. 30, 1992

[30] Foreign Application Priority Data

Jan. 31, 1991 [JP] Japan .................. 3-31532

[51] Int. Cl.$^5$ .................. B24B 5/02; B24B 41/06
[52] U.S. Cl. .................. 51/237 R; 51/216 R; 51/236; 269/21
[58] Field of Search ............. 51/103 R, 103 C, 105 R, 51/49, 48 R, 50 R, 216 R, 216 T, 236, 237 R, 289 R; 269/21

[56] References Cited

U.S. PATENT DOCUMENTS

| | | | |
|---|---|---|---|
| 1,880,377 | 10/1932 | Dyer | 51/103 R |
| 2,311,525 | 2/1943 | Ebbs | 269/21 |
| 3,084,928 | 4/1963 | Opitz | 269/21 |
| 3,460,822 | 8/1969 | Linh | 269/21 |
| 3,833,230 | 9/1974 | Noll | 269/21 |
| 4,009,538 | 3/1977 | Hanecker | 51/103 C |
| 4,398,579 | 8/1983 | Holdahl et al. | 142/53 |
| 5,042,772 | 8/1991 | Madjeski | 269/21 |
| 5,110,239 | 5/1992 | Riley | 269/21 |

FOREIGN PATENT DOCUMENTS

| | | | |
|---|---|---|---|
| 0359591 | 3/1990 | European Pat. Off. | |
| 501671 | 6/1930 | Fed. Rep. of Germany | 51/105 R |
| 2619985 | 11/1977 | Fed. Rep. of Germany | |
| 3036489 | 5/1982 | Fed. Rep. of Germany | |
| 49004 | 4/1990 | Fed. Rep. of Germany | 51/103 C |
| 48809 | 9/1988 | France | 269/21 |

Primary Examiner—Bruce M. Kisliuk
Assistant Examiner—Bo Bounkong
Attorney, Agent, or Firm—Browdy and Neimark

[57] ABSTRACT

A jig is provided for accurately and easily positioning a single crystal ingot with respect to the clamp rotary shafts of a device for grinding the peripheral surface of the ingot. The jig includes male positioning fixtures 10L and 10R and female positioning fixtures 32L and 32R. In the male positioning fixtures, negative-pressure suction cups 105 made of an elastic or viscoelastic material and blocks 101 at the backs of the cups are integrally formed with each other. In the female positioning fixtures, holes 325 are formed at the ends of the clamp rotary shafts 30L and 30R of the grinding device. The male positioning fixtures are accommodated in the holes, and the blocks are fitted into the holes so as to be concentric with the clamp rotary shafts.

4 Claims, 5 Drawing Sheets

JIG FOR CLAMP-POSITIONING SINGLE CRYSTAL INGOT

BACKGROUND OF THE INVENTION

1. Field of the Invention

The present invention relates to a jig for positioning a single crystal ingot with respect to the clamp rotary shafts of a device for grinding the peripheral surface of this ingot.

2. Description of the Related Art

A single crystal ingot grown by a CZ or FZ method is formed into a cylinder by the following processes:

(1) Both ends of the single crystal ingot are cut perpendicularly to the axial direction thereof so as to form a cylinder like body.

(2) As shown in FIG. 5, clamp rotary shafts 31L and 31R are pressed against cut surfaces 21L and 21R of the single crystal ingot 20 to clamp it slightly. Gauges 70 and 71 are fixed above both ends of the single crystal ingot 20. Movable pins of the gauges for detecting the shape of the single crystal ingot 20 are brought into elastic contact with the periphery of the ingot 20. Under the above conditions, the single crystal ingot 20 is rotated, and the gauges 70 and 71 measure the peripheral shape of the ingot 20 as displacements of the ends of the movable pins so that the positional deviations between a center of the cut surface 21L and the axis of the clamp rotary shaft 31 and between a center of the cut surface 21R and the axis of the clamp rotary shaft 31R are computed.

(3) The rotation of the single crystal ingot 20 is stopped, and the ends of the single crystal ingot 20 are forced with a hammer into a new position to minimize such positional deviation.

(4) The above processes (2) and (3) are repeated until there is no substantial positional deviation.

(5) The single crystal ingot 20 is tightly clamped by the clamp rotary shafts 31L and 31R, and is rotated. A grinding stone is brought into contact with the peripheral surface of the single crystal ingot 20 while it is moving, thus grinding it into a cylinder.

However, when the single crystal ingot 20 is clamped in process (1), it is positioned by visual observation; consequently, there is a relatively large amount of positional deviation from the ideal. To correct this deviation, the single crystal ingot 20 must be forced into a new position with a hammer several times, thus producing an unfavorable effect on the quality of the ingot 20 by the external mechanical shock.

Furthermore, it is necessary to repeat process (2) to accurately position the single crystal ingot. Thus, such an operation is complicated and time-consuming.

SUMMARY OF THE INVENTION

In view of the above problems, an object of the present invention is to provide a jig for accurately and easily clamp-positioning a single crystal ingot with respect to clamp rotary shafts.

In accordance with one aspect of the present invention, there is provided a jig for clamp-positioning a single crystal ingot, comprising: male positioning fixtures (10L and 10R) in which negative-pressure suction cups (105) and blocks (101) at the backs of the cups are integrally formed with each other, recesses capable of making openings airtight against flat surfaces being formed in the cups made of an elastic or viscoelastic material; and female positioning fixtures (32L and 32R) in which holes (325) are formed at ends of clamp rotary shafts (30L and 30R) of a device for grinding a peripheral surface of the single crystal ingot, the male positioning fixtures being accommodated in the holes and the blocks being fitted into the holes so as to be concentric with the clamp rotary shafts.

The jig is employed as follows:

(1) The suction cups of the male positioning fixtures are pressed against and suctioned under negative pressure to the centers of both end surfaces of the single crystal ingot, which surfaces are cut perpendicularly to the axial direction of the ingot.

(2) The blocks of the male positioning fixtures are fitted into the holes of the female positioning fixtures at the ends of the two clamp rotary shafts facing each other.

As obvious from the above method of using the jig, it becomes accurate and easy to position the single crystal ingot with respect to the clamp rotary shafts.

Step (1) will be described in detail for only one end of the single crystal ingot.

(1a) A centering hole having a diameter which is slightly larger than the diameter of one end of the suction cup is formed in a transparent plate, a centering plate. A centering circle is drawn on the centering plate, which circle is concentric with the centering hole and has a diameter substantially equal to that of the single crystal ingot. The centering plate is pressed against the cut surfaces of the single crystal ingot.

(1b) The centering hole is positioned on the basis of the relative positions of the centering hole of the centering plate and the outer periphery of the single crystal ingot.

(1c) The suction cup is pressed against the cut surface of the single crystal ingot so that the center of the cup agrees with that of the centering hole in the centering plate.

It is possible to accurately and easily suction the male positioning fixtures to the centers of the cut surfaces of the single crystal ingot.

The suction cups and the blocks, for example, are originally separate components, which can be formed integrally with each other in the following way. Screws penetrate the shaft centers of the suction cups. Ends of the screws are mated with the blocks, and the heads of the screws are inserted into the recesses. Screw holes are formed at the shaft centers of the heads of the screws.

After the peripheral surface of the single crystal ingot has been ground, if it is difficult to disengage the male positioning fixtures from the female positioning fixtures, a screw provided separately from the above screw is inserted into the screw hole, and is pulled in the axial direction thereof, thus making disengagement easy.

The blocks of the male positioning fixtures have the shape of, for example, a truncated conical portion. The degree to which the holes formed in the female positioning fixtures is the same as the degree to which the tapered peripheral surfaces of the truncated cone portions taper.

This tapering makes it easier to mate the male positioning fixtures with the female positioning fixtures.

The female positioning fixtures are linked to, for example, ends of the clamp rotary shafts.

Because of such linkage, the present invention may readily be applied to an existing device for grinding the peripheral surface of a single crystal ingot.

BRIEF DESCRIPTION OF THE DWARINGS

DESCRIPTION OF THE PREFERRED EMBODIMENT

An embodiment of the present invention will be described below with reference to the drawings.

Figure 1:
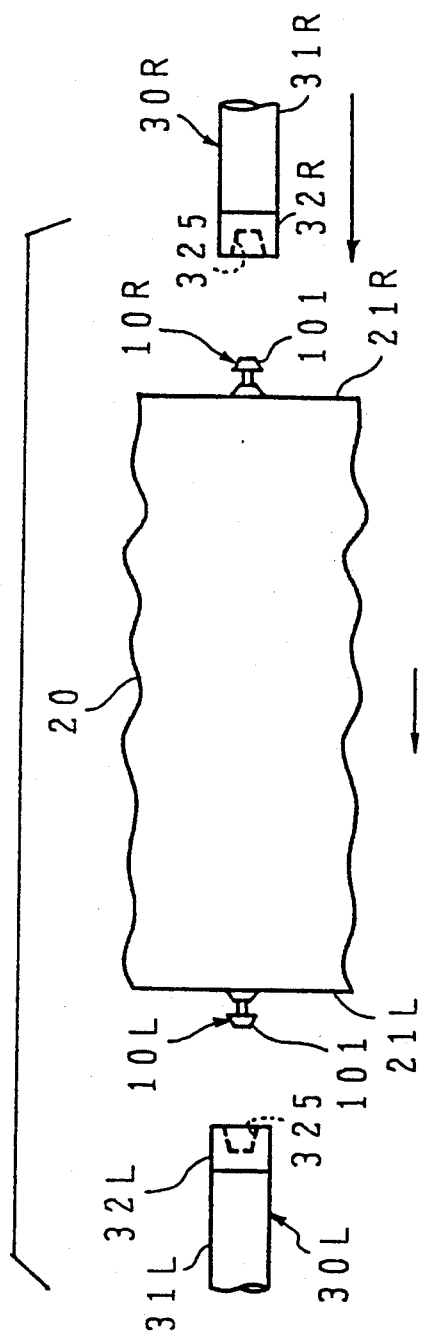
FIG. 1 is a side view illustrating the clamping of a single crystal ingot to clamp rotary shafts.

As shown in FIG. 1, male positioning fixtures 10L and 10R are respectively suctioned to the centers of cut surfaces 21L and 21R of a single crystal ingot 20. These surfaces 21L and 21R are formed by cutting both ends of the single crystal ingot 20 perpendicularly to the axial direction thereof. The male positioning fixtures 10L and 10R have the same structure, which will be shown in FIGS. 2 and 3.

The following description will be for only the left side of the single crystal ingot 20.

A tapered block 101 has the shape of a substantially truncated cone. A screw hole 102 (see FIG. 2) is formed at the center of the end of the tapered block 101 which has a larger diameter. The inside diameter of the screw hole 102 is the same as those of a collar 103 and a washer 104, both fixed to the tapered block 101. A hole is formed penetrating the shaft center of a cup 105 and has the same inside diameter as those of the screw hole 102, the collar 103 and the washer 104. The cup 105 is formed of rubber or synthetic resin with elasticity or viscoelasticity. A setscrew 106 is inserted into the hole penetrating the cup 105, the washer 104 and the collar 103. Thus, the ends of the setscrew 106 are mated with the screw hole 102 in the tapered block 101. The tapered block 101, the collar 103, the washer 104 and the cup 105 are integrally formed with each other. Another screw hole 107 is formed at the shaft center of the head of the setscrew 107. A withdrawing screw 108 is provided which is separated from the setscrew 106 and can be mated with the screw hole 107 for removing the male positioning fixture 10L when it is difficult to disengage it from a female positioning fixture 32L.

As shown in FIG. 1, a device for grinding the peripheral surface of the single crystal ingot 20 is disposed so that a clamp rotary shaft 30L of such a grinding device coaxially faces another clamp rotary shaft 30R of such grinding device capable of moving in the axial direction thereof. The clamp shaft 30L is a rotary driving shaft, the clamp shaft 30R, a rotary driven shaft. The female positioning fixture 32L is linked to one end of the clamp rotary shaft 30L, and another female positioning fixture 32R is linked to one end of the clamp rotary shaft 30R. The ends of the clamp rotary shafts 30L and 30R have the same structure.

Figure 2:
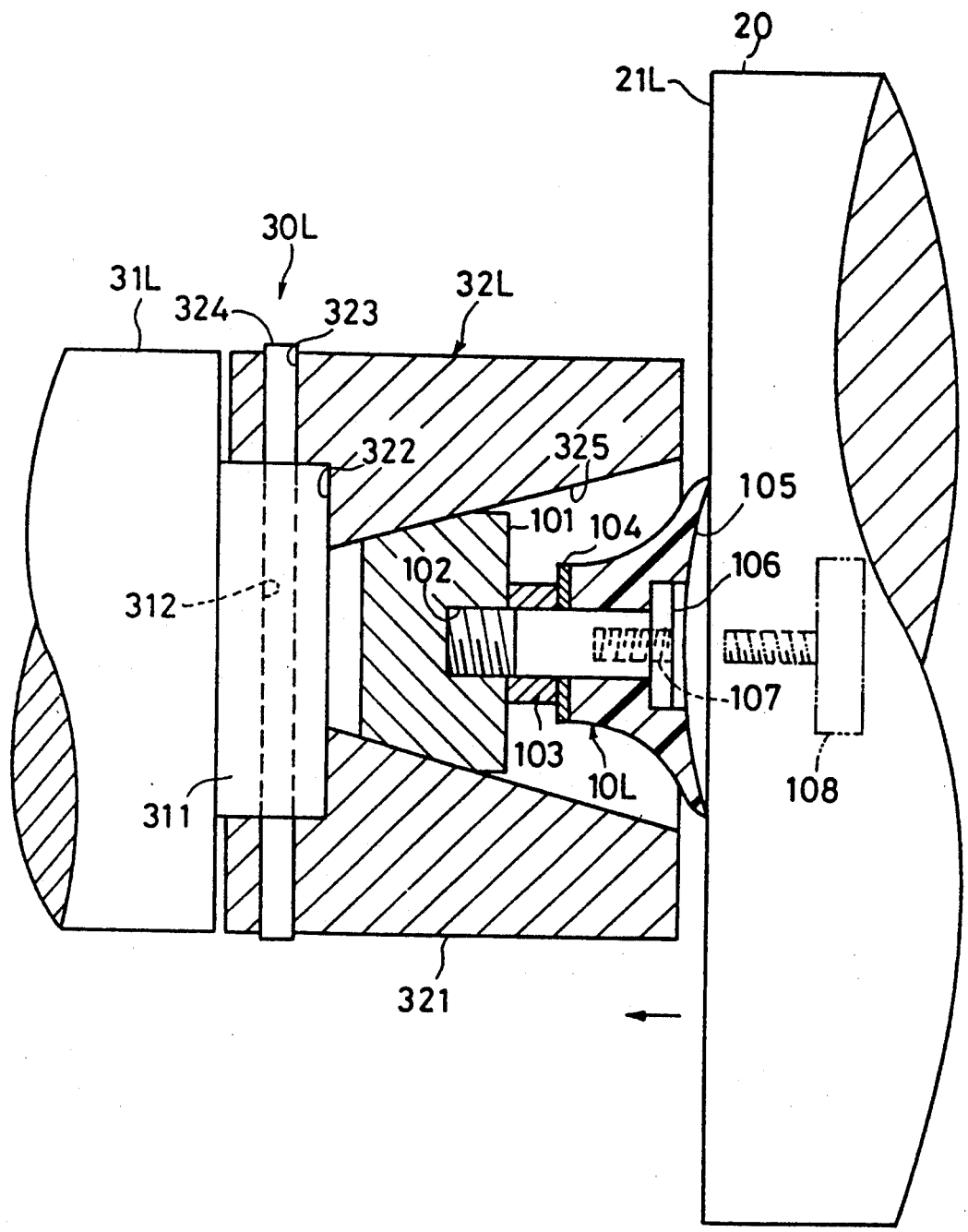
FIG. 2 is a sectional view of a jig for clamp-positioning the single crystal ingot.
Figure 3:
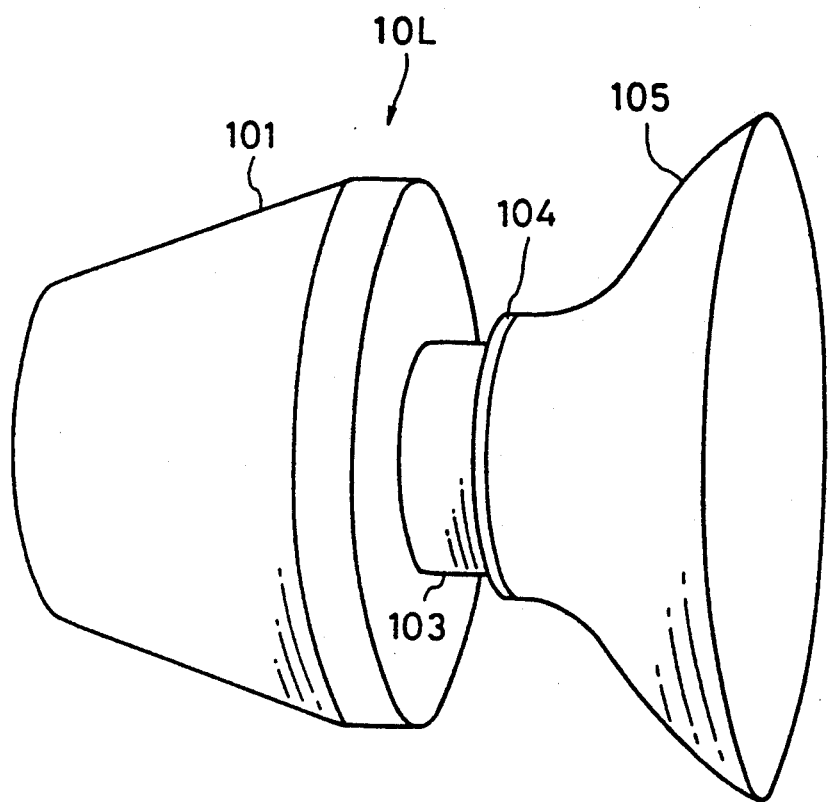
FIG. 3 is a perspective view showing a male positioning fixture of the jig.

As illustrated in FIG. 2, a cylindrical connecting projection 311, which is formed by grinding the peripheral surface thereof, is provided at one end of a shaft 31L. A pin hole 312 runs in the diametrical direction of the connecting projection 311. A cylindrical connecting recess 322 is formed in a short shaft 321 of the female positioning fixture 32L so as to correspond to the connecting projection 311. Another pin hole 323 is formed corresponding to the pin hole 312. The connecting projection 311 is mated with the connecting recess 322, and a retaining pin 324 is inserted into the pin holes 312 and 323. The shaft 31L is linked to the female positioning fixture 32L. A tapered hole 325 is formed at the shaft center of the short shaft 321 so that one end of the short shaft 321 communicates with the connecting recess 322. The tapered hole 325 has the shape of a truncated cone with a smaller diameter at the side of the connecting recess 322. The degree to which the hole 325 tapers is equal to the degree to which block 101 of the male positioning fixture 10L tapers.

Figure 4:
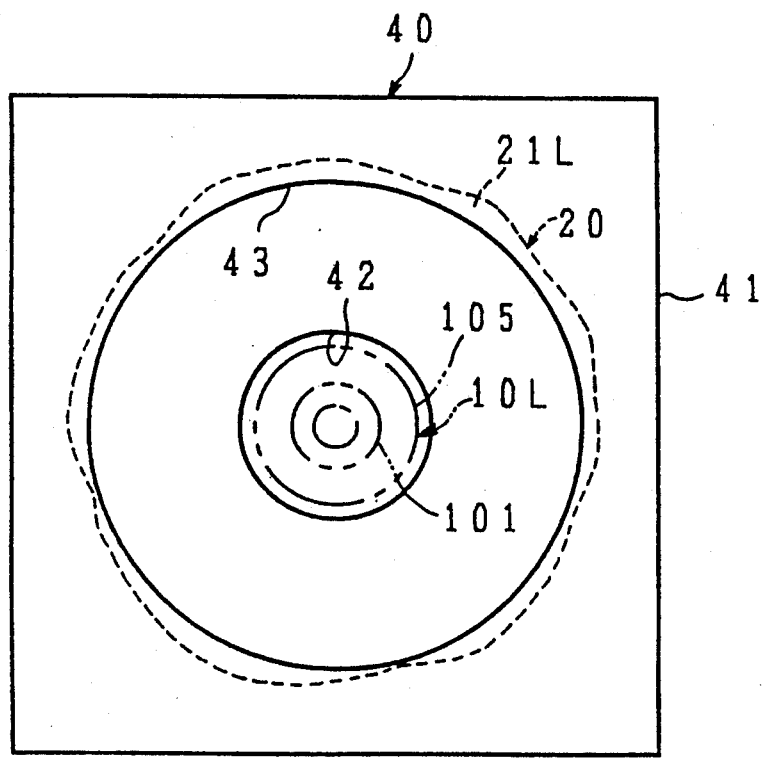
FIG. 4 is a view illustrating how a female positioning fixture is positioned with respect to a cut surface of the single crystal ingot.
Figure 5:
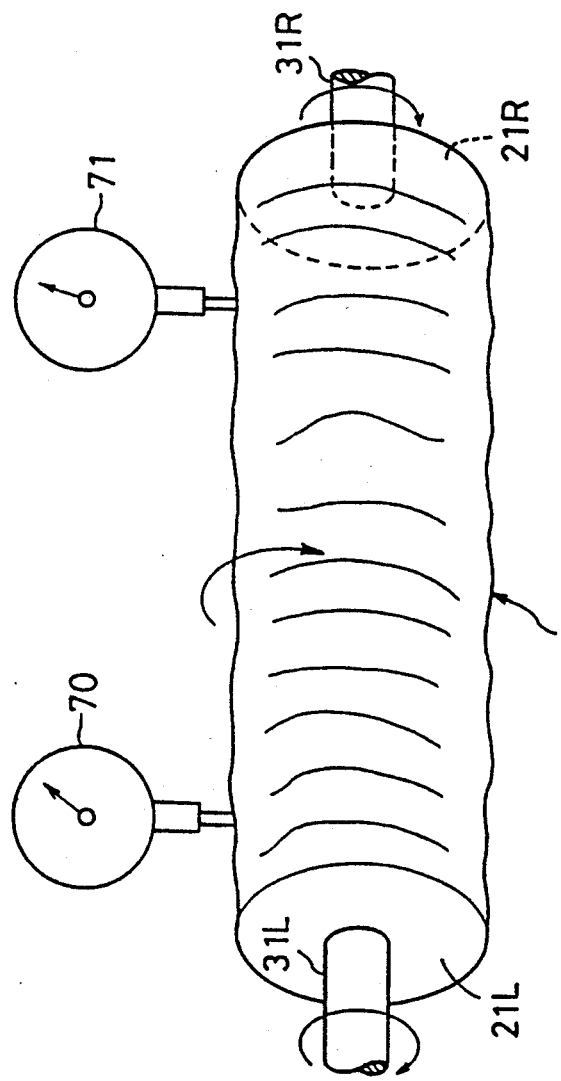
FIG. 5 is a perspective view illustrating problems with the conventional method.

As shown in FIG. 4, a centering plate 40 is used to center the male positioning fixture 10L where it is suctioned to the cut surface 21L. The centering plate 40 is a transparent plate, such as a rectangular acrylic-made plate 41, with a centering hole 42 formed at the center thereof. The inside diameter of the centering hole 42 is larger by several millimeters than the diameter of the cup 105 fully suctioned. A centering circle 43 which is concentric with the centering hole 42 is drawn on the surface of the transparent plate 41. The centering circle 43 can be accurately and easily scribed as, for example, by a lathe. The diameter of the centering circle 43 is equal to the outside diameter of a cylinder formed by grinding the peripheral surface of the single crystal ingot 20. It is smaller by several millimeters than the average diameter of the cut surface 21L of the single crystal ingot 20.

A description will be given of a method of employing the thus-constructed jig to clamp-position a single crystal ingot.

(1) Apply the centering plate 40 to the cut surface 21L on one end of the single crystal ingot 20.

(2) As shown in FIG. 4, the centering hole 42 is positioned on the basis of the relationship between the centering circle 43 and the cut surface 21L of the single crystal ingot 20. For instance, the centering hole 42 is positioned so that the centering circle 43 becomes concentric with the imaginary inscribed circle of the cut surface 21L.

(3) Under the above conditions, the cup 105 of the male positioning fixture 10L is pressed against the cut surface 21L so that the cup 105 is concentric with the centering hole 42. The male positioning fixture 10L is suctioned to the cut surface 21L.

(4) The steps (1) to (3) are repeated for the cut surface 21R on the other end of the single crystal ingot 20.

(5) As shown in FIG. 1, the single crystal ingot 20 is interposed between the clamp rotary shafts 30L and 30R. The tapered block 101 of the male positioning fixture 10L is mated with the tapered hole 325 of the female positioning fixture 32L.

(6) Under such conditions, the clamp rotary shaft 30R is brought at a high speed near the cut surface 21R of the single crystal ingot 20. The tapered block 101 of the male positioning fixture 10R is mated with the other tapered hole 325 of the female positioning fixture 32R while slowly bringing the shaft 30R near the cut surface 21R. One end of the female positioning fixture 32R is pressed against the cut surface 21R, and at the same time one end of the female positioning fixture 32L is pressed against the cut surface 21L.

In this way, it is possible to accurately and easily position the single crystal ingot 20 with respect to the clamp rotary shafts 30L and 30R.

Under the conditions mentioned above, the clamp shaft 30L is rotatively driven, thereby rotating the single crystal ingot 20. An unillustrated grinding stone is pressed against the peripheral surface of the single crystal ingot 20 to grind it into a cylindrical form.

After grinding has been completed, the clamp rotary shafts 30L and 30R are moved away from each other to remove the single crystal ingot 20 from the grinding device. When it is difficult to disengage the male positioning fixtures 10L and 10R from the female positioning fixtures 32L and 32R, respectively, the drawing screw 108 is inserted into the screw hole 107 and is pulled in the axial direction thereof to disengage the male positioning fixtures 10L and 10R.

The present invention includes various modifications other than the embodiment described above. For example, it may be applied where the male positioning fixtures 10L and 10R are integrally formed of synthetic resin, or may be applied where the clamp rotary shafts 30L and 30R are also integrally formed.

What is claimed is:

1. A jig clamp-positioning a single crystal ingot having an uneven peripheral surface and two flat parallel ends each having a center, comprising:
    a pair of male positioning fixtures (10L, 10R) each having an elastic or viscoelastic cup (105) for suction attachment to the center of one of the ends of the single crystal ingot by pressing an open end of said cup against a flat end of the single crystal so as to make an interior of said cup airtight and attach to a flat end by negative pressure, each said cup having a block (101) fixed thereto at an opposite end to said open end, each said block being tapered and concentric with said cup; and
    a pair of female positioning fixtures (32L, 32R), each formed at an end of a pair of clamp rotary shafts (30L, 30R) of a device for grinding the peripheral surface of the single crystal ingot, each said female positioning fixture having a hole (325) for accommodating said male positioning fixture by removably fitting said block into said hole, said hole being concentric with said clamp rotary shaft, wherein at least one of said female positioning fixtures (32L, 32R) is linked with a respective said end of said clamp rotary shaft (30L, 30R) by pin (324) arranged perpendicular to the axis of said clamp rotary shaft such that said female positioning fixture is rotatable about said pin
    each said hole having a tapered wall with a degree of taper substantially the same as said block,
    said cup of each said male positioning fixture contacting an end of the ingot and each male positioning fixture being within said each hole when the single crystal ingot is clamped by said clamp rotary shafts.

2. A jig according to claim 1, wherein said cup (105) is fixed at said opposite end of said cup to said block by engaging a screw (106) through a central axis of said cup and said block, a head of said screw being disposed at a bottom of said open end of said cup, a screw hole (107) being formed at a center of said head of said screw, said screw hole (107) constituting means for detaching said male positioning fixture (10L, 10R) from said hole of said female positioning fixture (32L, 32R) by engaging a detaching screw (108) into said screw hole and pulling said detaching screw.

3. A jig according to claim 1, wherein said block (101) of said male positioning fixture (10L, 10R) has a truncated conical portion and a shape complimentary to said hole (325) of said male positioning fixture which has a truncated conical receiving wall.

4. A jig according to claim 1 further comprising:
    means for locating an approximately center area on each of said two flat parallel ends, said means comprising a transparent centering plate (40) having a center circle hole (42) and a centering circle (43) inscribed about said circle hole such that said centering circle can be approximately aligned in a concentric fashion with an end of said single crystal ingot.

* * * * *